United States Patent
Zohni et al.

(10) Patent No.: US 10,840,192 B1
(45) Date of Patent: Nov. 17, 2020

(54) STACKED SILICON PACKAGE ASSEMBLY HAVING ENHANCED STIFFENER

(71) Applicant: Xilinx, Inc., San Jose, CA (US)

(72) Inventors: Nael Zohni, San Jose, CA (US); Shin S. Low, Cupertino, CA (US); Inderjit Singh, Saratoga, CA (US); Raghunandan Chaware, Sunnyvale, CA (US); Ganesh Hariharan, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 55 days.

(21) Appl. No.: 15/481,275

(22) Filed: Apr. 6, 2017

Related U.S. Application Data

(62) Division of application No. 14/990,560, filed on Jan. 7, 2016, now abandoned.

(51) Int. Cl.
| | |
|---|---|
| H01L 23/00 | (2006.01) |
| H01L 23/04 | (2006.01) |
| H01L 21/52 | (2006.01) |
| H01L 21/54 | (2006.01) |
| H01L 21/48 | (2006.01) |

(52) U.S. Cl.
CPC ........ H01L 23/562 (2013.01); H01L 21/4817 (2013.01); H01L 21/52 (2013.01); H01L 21/54 (2013.01); H01L 23/04 (2013.01); H01L 24/14 (2013.01); *H01L 2224/145* (2013.01); *H01L 2224/1412* (2013.01)

(58) Field of Classification Search
CPC ... H01L 23/562; H01L 21/4817; H01L 21/52; H01L 23/04; H01L 24/14; H01L 21/54; H01L 2224/145; H01L 2224/1412; H01L 23/34–4735

USPC .................. 257/712–713, E23.08–E23.113
See application file for complete search history.

(56) References Cited

U.S. PATENT DOCUMENTS

| | | | |
|---|---|---|---|
| 4,092,697 | A | 5/1978 | Spaight |
| 4,265,775 | A | 5/1981 | Aakalu |
| 5,028,984 | A | 7/1991 | Ameen |

(Continued)

FOREIGN PATENT DOCUMENTS

| | | | |
|---|---|---|---|
| JP | 2001135937 A | 5/2001 |
| JP | 2001196487 A | 7/2001 |

(Continued)

OTHER PUBLICATIONS

Specification and drawings for U.S. Appl. No. 14/990,560, filed Jan. 7, 2016.

*Primary Examiner* — Hoang-Quan Ho
(74) *Attorney, Agent, or Firm* — Patterson + Sheridan, LLP

(57) ABSTRACT

A chip package assembly and method for fabricating the same are provided which utilize a stiffener to improve a package substrate against out of plane deformation. In one example, a chip package assembly is provided that includes a package substrate, at least one integrated circuit (IC) die and a stiffener. The package substrate has a first surface and a second surface coupled by a side wall. The at least one IC die is disposed on the first surface of the package substrate. The stiffener is disposed outward of the at least one IC die. The stiffener has a first surface disposed outward of and bonded to the side wall of the package substrate. The stiffener has a second surface bonded to at least one of the first and second surfaces of the package substrate.

21 Claims, 9 Drawing Sheets

(56) References Cited

U.S. PATENT DOCUMENTS

| | | | |
|---|---|---|---|
| 5,471,027 A | 11/1995 | Call | |
| 5,710,459 A | 1/1998 | Teng | |
| 5,956,576 A | 9/1999 | Toy | |
| 6,218,730 B1 | 4/2001 | Toy | |
| 6,646,356 B1 | 11/2003 | Whalen | |
| 2005/0067178 A1* | 3/2005 | Pearson | H01L 23/10 174/548 |
| 2006/0220224 A1* | 10/2006 | Cheng | H01L 25/105 257/706 |
| 2008/0001308 A1* | 1/2008 | Chen | H01L 23/16 257/778 |
| 2008/0042263 A1 | 2/2008 | Wang | |
| 2009/0261472 A1* | 10/2009 | Bayerer | H01L 24/06 257/719 |
| 2009/0321925 A1 | 12/2009 | Gealer et al. | |
| 2013/0154085 A1* | 6/2013 | Choi | H01L 23/36 257/720 |
| 2014/0167243 A1 | 6/2014 | Shen | |
| 2014/0175665 A1 | 6/2014 | Kang | |
| 2015/0262904 A1* | 9/2015 | Hung | H01L 23/367 257/713 |

FOREIGN PATENT DOCUMENTS

| | | | |
|---|---|---|---|
| JP | 2003068931 A | | 3/2003 |
| JP | 2003100924 A | | 4/2003 |
| JP | 2005159136 A | * | 6/2005 |
| JP | 2005159136 A | | 6/2005 |
| JP | 2006196857 A | | 7/2006 |
| JP | 2010192653 A | | 9/2010 |

\* cited by examiner

STACKED SILICON PACKAGE ASSEMBLY HAVING ENHANCED STIFFENER

CROSS-REFERENCE TO RELATED APPLICATIONS

This Application is a divisional of U.S. application Ser. No. 14/990,560, filed Jan. 7, 2016, which is incorporated herein by reference in its entirety.

TECHNICAL FIELD

Embodiments of the present invention generally relate to a chip package assembly, and in particular, to chip package assembly comprising at least one integrated circuit (IC) die and stiffener disposed on a package substrate, the stiffener stiffening the package substrate against out of plane deformation.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dice to be mounted to a single package substrate. The IC dice may include memory, logic or other IC devices.

Out of plane deformation of the package substrate can be problematic to conventional chip packaging schemes. In many instances, a stiffener is utilized to stiffening the package substrate against out of plane deformation. However, particularly in larger chip package assemblies, the stiffener itself may bend or twist, or even become delaminated from package substrate, thus still permitting undesirable warpage and bending during manufacture and/or use. Such warpage and bending of the package substrate can lead to solder connection failure or other damage to the components and devices of the chip package assembly, which may detrimentally effect device performance and reliability.

Therefore, a need exists for an improved chip package assembly, and in particular, to a chip package assembly having an improved stiffener.

SUMMARY

A chip package assembly and method for fabricating the same are provided which utilize a stiffener to improve a package substrate against out of plane deformation. In one example, a chip package assembly is provided that includes a package substrate, at least one integrated circuit (IC) die and a stiffener. The package substrate has a first surface and a second surface coupled by a side wall. The at least one IC die is disposed on the first surface of the package substrate. The stiffener is disposed outward of the at least one IC die. The stiffener has a first surface disposed outward of and bonded to the side wall of the package substrate. The stiffener has a second surface bonded to at least one of the first and second surfaces of the package substrate In another example, a method for fabricating a chip package assembly is provided that includes attaching a stiffener to a package substrate prior to attaching one or more IC dice to the package substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and method for fabricating the same are provided which utilize an improved stiffener. The chip package assembly described herein includes at least one integrated circuit (IC) die and stiffener disposed on a package substrate. The stiffener is configured to increase the resistance of the package substrate to out of plane deformation during the fabrication and use of the chip package assembly. Advantageously, the enhanced stiffness of the chip package assembly improves reliability and performance. In various examples described herein one or more advantages may be realized that include stiffening the package substrate both the horizontal and vertical axis, greater area for adhesive attach for reduced delamination, more space for surface mounted circuit elements, such as chip capacitors, thinner package profile and ball grid array (BGA) stand-off height control, among other benefits.

Figure 1:
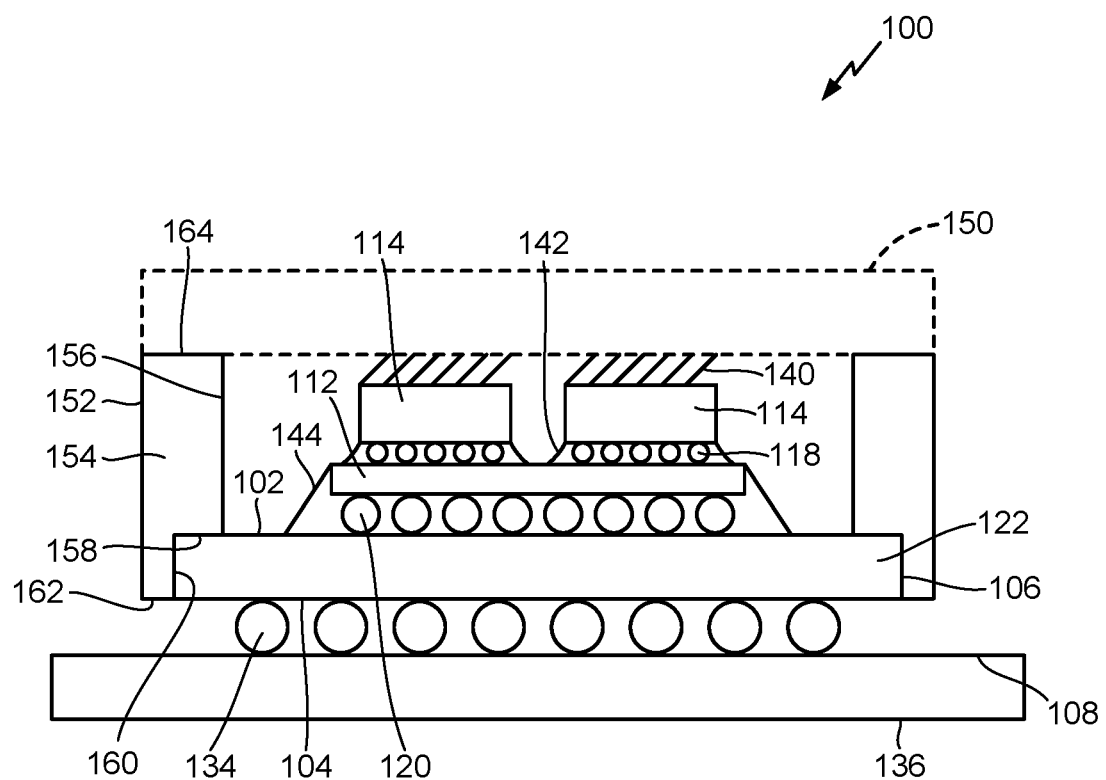
FIGS. 1-4 are a cross sectional schematic views of integrated chip package assemblies, each including at least one integrated circuit (IC) die and stiffener disposed on a package substrate.

Turning now to FIG. 1, an exemplary integrated chip package assembly 100 is schematically illustrated. The chip package assembly 100 includes at least one or more IC dice 114 connected optionally by a silicon-through-via (TSV) interposer 112 to a package substrate 122. Although two IC dice 114 are shown in FIG. 1, the number of IC dice may range from one to as many as can be fit within the chip package assembly 100. In some implementations, the interposer 112 may be omitted with the one or more IC dice 114 connected directly to a top surface 102 of the package substrate 122. A stiffener 154 is coupled to at least one side wall 106 of the package substrate 122 in a manner that enhances the resistance of the package substrate 122 against out of plane deformation, as further discussed below.

The interposer 112, when present, includes circuitry for electrically connecting the dice 114 to circuitry of the package substrate 122. The circuitry of the interposer 112 may optionally include transistors and/or other circuit elements. Package bumps 120, also known as "C4 bumps," are utilized to provide an electrical connection between the circuitry of the interposer 112 and the circuitry of the package substrate 122. A bottom surface 104 of the package substrate 122 may be mounted and connected to a top surface 108 of a printed circuit board (PCB) 136, utilizing solder balls 134, wire bonding or other suitable technique. An undermolding 144 may be utilized to fill the space not taken by the package bumps 120 between the PCB 136 and the interposer 112.

The IC dice 114 are mounted to one or more surfaces of the interposer 112, or alternatively in implementations wherein an interposer is not utilized, to the package substrate 122. The IC dice 114 may be programmable logic devices, such as field programmable gate arrays (FPGA), memory devices, optical devices, processors or other IC logic structures. Optical devices include photo-detectors, lasers, optical sources, and the like. In the example depicted in FIG. 1, the IC dice 114 are mounted to a top surface of the interposer 112 by a plurality of micro-bumps 118. The micro-bumps 118 electrically connect the circuitry of each IC die 114 to circuitry of the interposer 112. The circuitry of the interposer 112 connects the micro-bumps 118 to selective package bumps 120, and hence, connects selective circuitry of each IC die 114 to the package substrate 122, to enable communication of the dice 114 with the PCB 136 after the chip package assembly 100 is mounted within an electronic device (not shown). When the optional interposer 112 is not present, the micro-bumps 118 connects selective circuitry of each IC die 114 to the package substrate 122 to enable communication of the dice 114 with the PCB 136. An undermolding 142 may be utilized to fill the space not taken by the micro-bumps 118 between the dice 114 and interposer 112.

An optional lid 150 (shown in phantom) is disposed over the dice 114. In some implementations, the lid 150 may be fabricated from a plastic material or other suitable material. In other implementations particularly where it is desirable to utilize the lid 150 to receive heat from the dice 114, the lid 150 may be fabricated from a thermally conductive material, such as copper, nickel-plated copper or aluminum, among other suitable materials. The lid 150 may have a thickness of between about 0.5 mm and about 3.0 mm, although other thicknesses may be utilized. A heat sink, not shown, may optionally be mounted to the lid 150.

The lid 150 may be coupled to the stiffener 154 to increase the rigidity of the chip package assembly 100. For example, the lid 150 may be coupled to the stiffener 154 by an adhesive (not shown), such as an epoxy.

An adhesive 140 may also be utilized to couple the lid 150 to the dice 114. The adhesive 140 may be selected to provide a thermally conductive path between the lid 150 to the dice 114 so that heat generated by the dice 114 may be dissipated through the lid 150. The adhesive 140 may be a soft or compliant adhesive to allow compensation between mismatched heights of neighboring dice 114 within the chip package assembly 100. In one example, the adhesive 140 may be a thermal gel or thermal epoxy, such as for example, packaging component attach adhesives available from AI Technology, Inc., located in Princeton Junction, N.J.

The stiffener 154 is coupled to the package substrate 122 outward the IC dice 114. The stiffener 154 extends beyond the side walls 106 of the package substrate 122 to provide mechanical support that helps prevent the chip package assembly 100 from bowing and twisting. The stiffener 154 may be a single layer structure or a multi-layer structure. The stiffener 154 may be a single one-piece structure or a multi-piece structure. The stiffener 154 may circumscribe the package substrate 122 as a single structure, or multiple connected or unconnected structures may be used. Although the stiffener 154 is only shown in sectional profile in FIG. 1, the stiffener 154 may have a closed ring shape, an open ring shape, or other shape suitable for increasing the rigidity of the package substrate 122.

The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate.

The stiffener 154 generally includes an inner wall 156 coupled to an outer wall 152 by a top wall 164. The stiffener 154 also includes a bottom wall 162 disposed at the opposite end of the stiffener 154 relative to the top wall 164. The bottom wall 162 is coupled at least to the outer wall 152.

The stiffener 154 includes a side mounting surface 160 and a bottom mounting surface 158 at the interface between the inner wall 156 and the bottom wall 162. In one example, the side mounting surface 160 is generally perpendicular to the planar orientation of the package substrate 122, and may be perpendicular to one or both of the top and bottom walls 164, 162. Similarly, the bottom mounting surface 158 is generally parallel to the planar orientation of the package substrate 122, and may be parallel to one or both of the top and bottom walls 164, 162. The side mounting surface 160 may extend from the inner wall 156 and intersect with the bottom mounting surface 158, with the bottom mounting surface 158 then extending to the bottom wall 162. The mounting surfaces 158, 160 also disrupt the generally rectangular profile of the stiffener 154, thereby increasing the rigidity of the stiffener 154. Additionally, as the bottom mounting surface 158 is only a fraction of the width between the inner and outer walls 156, 152 of the stiffener 154, the inner wall 156 is closer to the side wall 106 of the package substrate 122, thereby result in greater area of the top surface 102 of the package substrate 122 being exposed inward of the stiffener 154 as compared to conventional chip package assemblies. The greater top surface area of the package substrate 122 increases the area available to accommodate the IC dice 114 and surface mounted components, such as diodes, capacitors, resistors and the like.

The mounting surfaces 158, 160 are configured contact and secure the stiffener 154 to the package substrate 122. In one example, the bottom mounting surface 158 contacts and is bonded to the top surface 102 of the package substrate 122. The bottom mounting surface 158 may be bonded to the top surface 102 of the package substrate 122 utilizing an epoxy or other suitable adhesive. Examples of suitable adhesives for bonding the bottom mounting surface 158 to the top surface 102 include Henkel MC-723, Dow Corning SE-4450, and Shin-Etsu 9080S-1, among others.

Similarly, the side mounting surface 160 contacts and is bonded to the side wall 106 of the package substrate 122. The side mounting surface 160 may be bonded to the side wall 106 of the package substrate 122 utilizing an epoxy or other adhesive suitable for bonding the bottom mounting surface 158. Alternatively, one or both of the mounting surfaces 158, 160 may be secured to the package substrate 122 utilizing a mechanical technique, such as staking, snap fit, press fit, fastening or other suitable technique.

As the stiffener 154 is coupled to the side wall 106 of the package substrate 122, the outer wall 152 of the stiffener 154 is generally farther from the center of the package substrate 122 than the side wall 106 of the package substrate. In comparison, the outer wall of conventional stiffeners are generally the same distance as the side wall 106 from the center of the package substrate 122. As a result, the outer wall 152 of the stiffener 154 is generally farther from the center of the package substrate 122 then outer walls of conventional stiffeners, thereby providing protection to the side wall 106 of the package substrate 122 against chipping or other damage, while providing a larger surface area for handing the chip package assembly 100 during fabrication.

Bonding of the stiffener 154 to different planes (i.e., the top surface 102 and side wall 106) of the package substrate 122 increases the stiffness of the package substrate 122 as compared to conventional chip package assemblies having stiffeners solely bonded to the top surface of the package substrate. Moreover, the mounting surfaces 158, 160 provide an increased area for bonding the stiffener 154, which also increases the robustness of the stiffener-to-package substrate connection, such as increasing bond strength and minimizing the propensity for delamination. Still another advantage is that the side mounting surfaces 160, interfacing with the side wall 106 of the packing substrate 122, precisely locates the stiffener 154 on the top surface 102 of the packing substrate 122, thereby ensuring adequate room for later fabrication processes and components, while providing an excellent reference surface for automated fabrication and handling equipment and processes.

Figure 2:
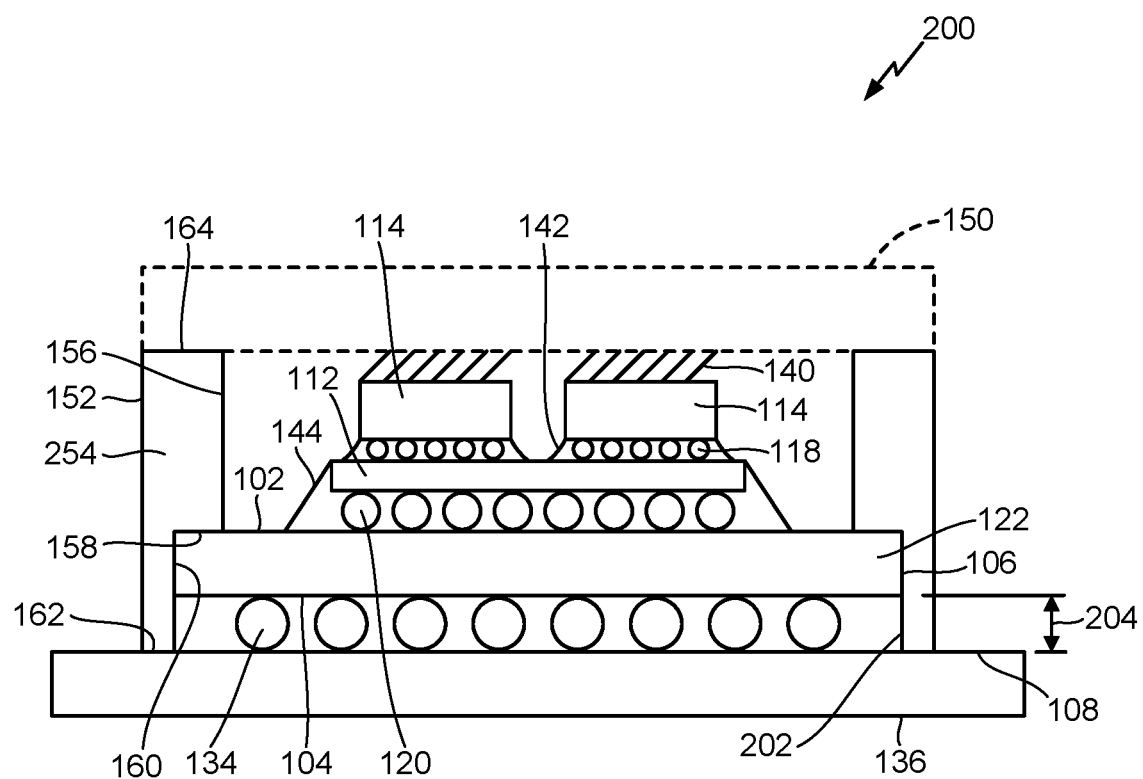

FIG. 2 is a cross sectional schematic view of another integrated chip package assembly 200 that includes at least one IC die 114 and stiffener 254 disposed on a package substrate 122. The integrated chip package assembly 200 is essentially the same as the integrated chip package assembly 100 depicted in FIG. 1, except that the stiffener 254 includes a standoff portion 202 extending below a bottom surface 104 of the package substrate 122.

The standoff portion 202 of the stiffener 254 may be defined as the portion of the outer wall 152 and side mounting surface 160 of the stiffener 254 that is disposed below the bottom surface 104 of the package substrate 122. The standoff portion 202 of the stiffener 254 may extend below the bottom surface 104 of the package substrate 122 a distance 204 to the bottom surface 162. The distance 204 may be selected to control the collapse height of the solder balls 134 disposed inward of the stiffener 254. In one implementation the distance 204 is selected be about 80 percent of the pre-collapse height of the solder balls 134. For example, during reflow, the solder balls 134 collapse during mounting of the chip package assembly 200 to the PCB 136. During mounting, the bottom wall 162 of the stiffener 254 contacts the top surface 108 of the PCB 136, thereby controlling the collapse height of the solder balls 134 to a predefined amount. Another advantage of the standoff portion 202 is that the standoff portion 202 protects the solder balls 134 prior to mounting to the PCB 136.

Figure 3:
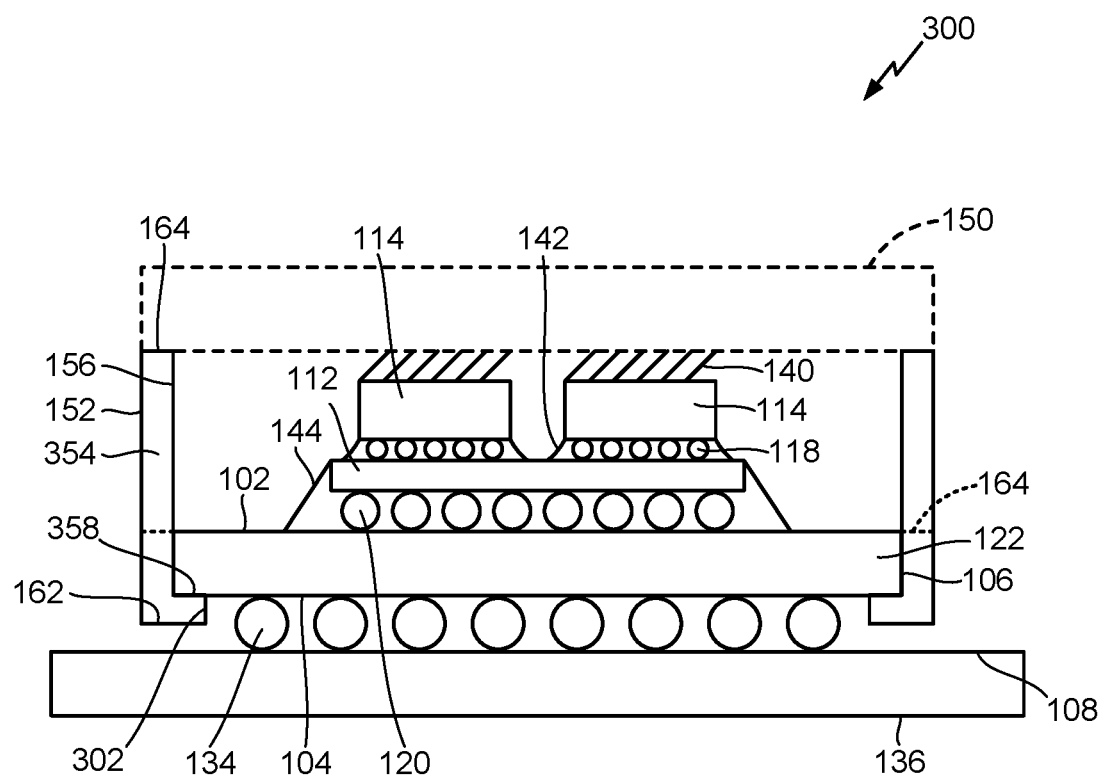

FIG. 3 is a cross sectional schematic view of another integrated chip package assembly 300 that includes at least one IC die 114 and stiffener 254 disposed on a package substrate 122. The integrated chip package assembly 300 is essentially the same as the integrated chip package assembly 100 depicted in FIG. 1, except that the stiffener 354 is mounted to both the side wall 106 and the bottom surface 104 of the package substrate 122.

For example, the side mounting surface 160 of the stiffener 254 contacts and is bonded to the side wall 106 of the package substrate 122 discussed above, while a top mounting surface 358 contacts and is bonded to the bottom surface 104 of the package substrate 122. The mounting surfaces 160, 358 may be bonded to the package substrate 122 utilizing an epoxy or other adhesive as discussed above.

In one implementation, the inner wall 156 of the stiffener 254 is advantageously outward of the side wall 106 of the package substrate 122, maximizing the area of the top surface 102 of the package substrate 122 available for die mounting or for surface mounted circuit components. Another advantage of the implementation depicted in FIG. 3 is that the bottom wall 162 of the stiffener 254 extends below the bottom surface 104 of the package substrate 122, thereby protecting the solder balls 134 prior to mounting to the PCB 136.

In the example illustrated in FIG. 3, the stiffener 354 is shown coupled to the optional lid 150. However, in other examples, the lid 150 may not be present. In still other examples, the top wall 164 of the stiffener 354 may be flush with, or slightly below the top surface 108 of the package substrate 122.

Figure 4:
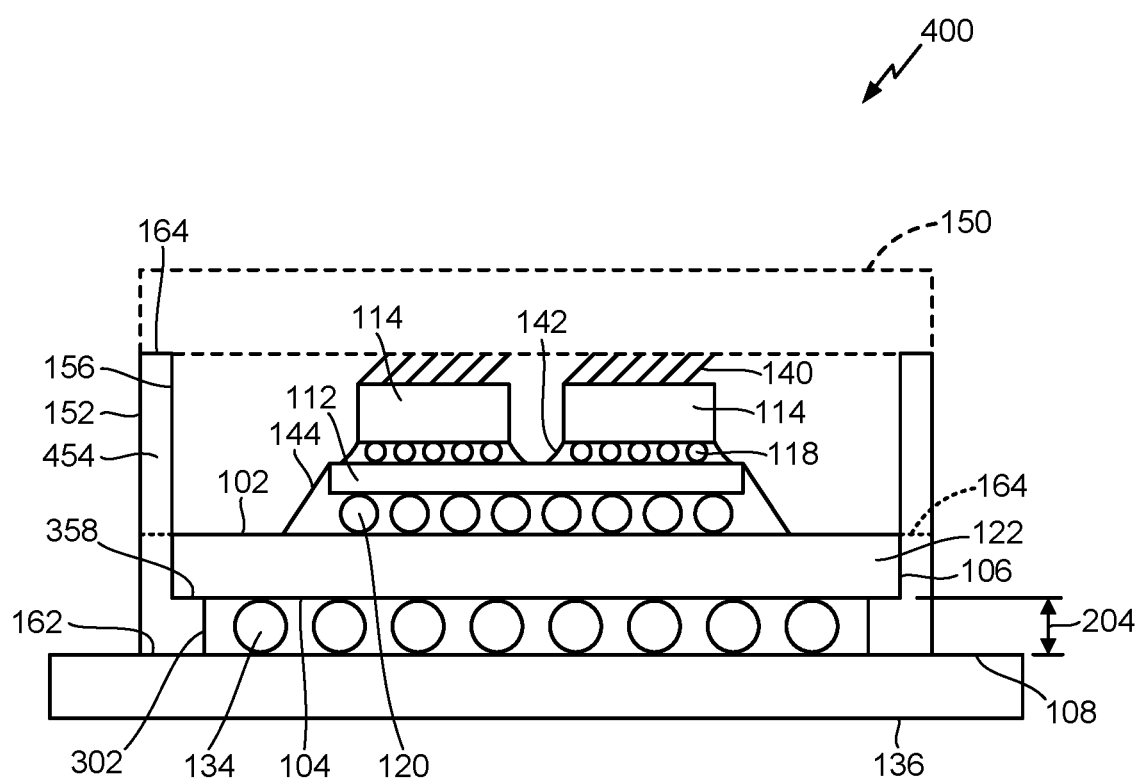

FIG. 4 is a cross sectional schematic view of another integrated chip package assembly 400 that includes at least one IC die 114 and stiffener 354 disposed on a package substrate 122. The integrated chip package assembly 400 is essentially the same as the integrated chip package assembly 400 depicted in FIG. 1, except that the stiffener 454 includes a standoff portion 202 extending below a bottom surface 104 of the package substrate 122. In other respects, the stiffener 454 is essentially the same as the stiffener 354.

In the implementation depicted in FIG. 4, the standoff portion 202 extends a distance 204 below the bottom surface 104 of the package substrate 122. As discussed above, the distance 204 may be selected to control the collapse height of the solder balls 134 disposed inward of the stiffener 254. In one implementation the distance 204 is selected be about 80 percent of the pre-collapse height of the solder balls 134. Another advantage of the standoff portion 202 is that the standoff portion 202 protects the solder balls 134 prior to mounting to the PCB 136.

In the example illustrated in FIG. 4, the stiffener 454 is shown coupled to the optional lid 150. However, in other examples, the lid 150 may not be present. In still other examples, the top wall 164 of the stiffener 454 may be flush with, or slightly below the top surface 108 of the package substrate 122.

Figure 5:
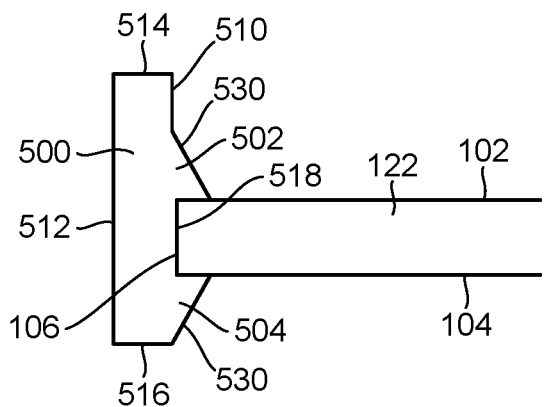
FIG. 5 is a partial sectional view of an alternative example of a stiffener which may be utilized in an integrated chip package assembly, such as the integrated chip package assemblies of FIGS. 1-4.

FIG. 5 is a partial sectional view of an alternative example of a stiffener 500 which may be utilized in an integrated chip package assembly, such as the integrated chip package assemblies 100, 200, 300, 400 of FIGS. 1-4, among others. Optionally, the stiffener 500 may include a standoff portion 202, as shown in FIG. 2 or FIG. 4.

Similar to the other stiffeners described herein, the stiffener 500 includes a top wall 514, a bottom wall 516, an outer wall 512 and an inner all 510. The inner wall 510 of the stiffener 500 includes a substrate edge receiving pocket 518 that is configured to capture the side wall 106 of the package substrate 122. The substrate edge receiving pocket 518 may be a groove or area between projections extending from the inner all 510 of the stiffener 500. In the implementation depicted in FIG. 5, the substrate edge receiving pocket 518 is defined between two barbs 502, 504 extending from the inner wall 510 of the stiffener 500. The barbs 502, 504 include an entrance angle 530 that facilitates the side wall 106 of the package substrate 122 to be slid and snap-fit into the substrate edge receiving pocket 518. In some implementations, use of an adhesive to bond the package substrate 122 into the substrate edge receiving pocket 518 may be omitted.

Figure 6:
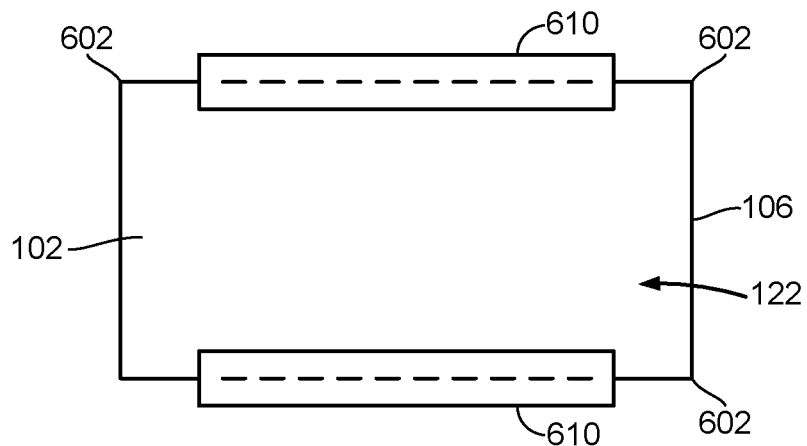
FIGS. 6-8 and 11 are top views stiffeners that may be utilized in an integrated chip package assembly, such as the integrated chip package assemblies of FIGS. 1-4.

FIG. 6 is top view of stiffeners 610 that may be utilized in an integrated chip package assembly, such as the integrated chip package assemblies 100, 200, 300, 400 of FIGS. 1-4, among others. The stiffeners 610 may be secured to the package substrate 122 of the chip package assembly 100 in any manner as described above, or other suitable manner.

The stiffeners 610 are disposed along edges of the side walls 106. Optionally, the stiffeners 610 may extend along edges of the side walls 106 to engage the corners 602 of the package substrate 122. The stiffeners 610 may have any of the profiles described above for the stiffeners 154, 254, 354, 454, 500, or other suitable profile. Although only one stiffener 610 is shown engaged with every other side wall 106 of the package substrate 122 in FIG. 6, one or more stiffeners 610 may be engaged with at least one side wall 106 of the package substrate 122. For example, one or more stiffeners 610 may be engaged with each of the four side walls 106 of the package substrate 122.

Additionally, although the stiffeners 610 are shown engaging the top surface 102 and side walls 106 of the package substrate 122, the stiffeners 610 may alternatively be engage the bottom surface 104 and side walls 106 of the package substrate 122 as shown in FIG. 3, or engage the package substrate with a receiving pocket 518 as shown in FIG. 5. Optionally, the stiffeners 610 may include a standoff portion 202, as shown in FIG. 2 or FIG. 4.

Figure 7:
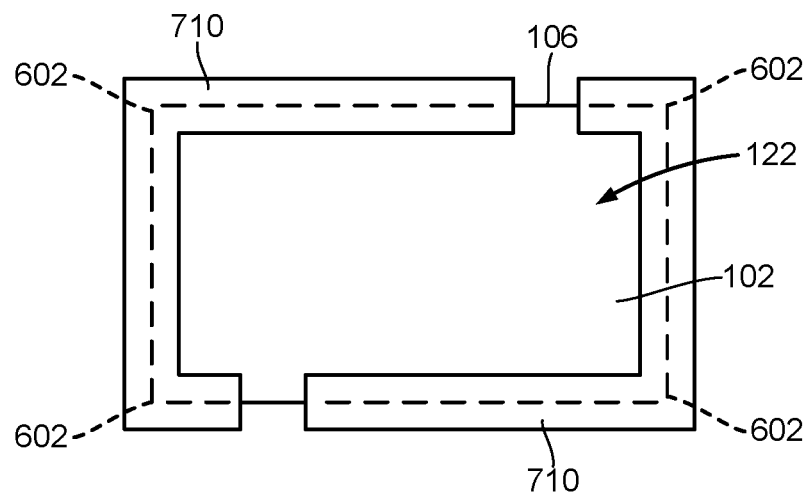

FIG. 7 is top view of stiffeners 710 that may be utilized in an integrated chip package assembly, such as the integrated chip package assemblies 100, 200, 300, 400 of FIGS. 1-4, among others. The stiffeners 710 may be secured to the package substrate 122 of the chip package assembly 100 in any manner as described above, or other suitable manner.

The stiffeners 710 are disposed along edges of the side walls 106 and engage at least one corner 602 of the package substrate 122. The stiffeners 710 may have any of the profiles described above for the stiffeners 154, 254, 354, 454, 500, 610, or other suitable profile. Although only two stiffeners 710 are shown circumscribing the perimeter of the side walls 106 of the package substrate 122 in FIG. 7, three or more stiffeners 710 may be utilized.

Additionally, although the stiffeners 710 are shown engaging the top surface 102 and side walls 106 of the package substrate 122, the stiffeners 710 may alternatively be engage the bottom surface 104 and side walls 106 of the package substrate 122 as shown in FIG. 3, or engage the package substrate with a receiving pocket 518 as shown in FIG. 5.

Figure 8:
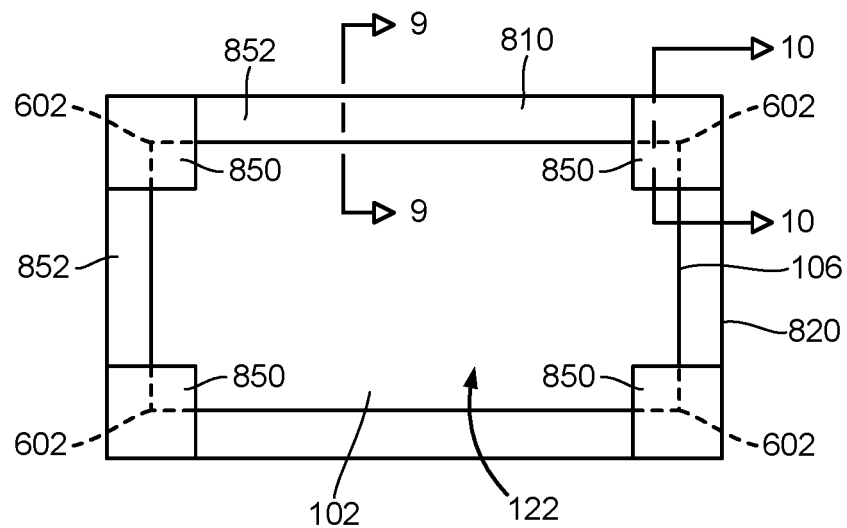

FIG. 8 is top view of a stiffener 810 that may be utilized in an integrated chip package assembly, such as the integrated chip package assemblies 100, 200, 300, 400 of FIGS. 1-4, among others. The stiffener 810 may be secured to the package substrate 122 of the chip package assembly 100 in any manner as described above, or other suitable manner. Although only a single ring-shaped stiffener 810 is shown circumscribing the perimeter of the side walls 106 of the package substrate 122 in FIG. 8, multiple stiffeners 810 may be utilized.

The stiffener 810 is disposed along edges of the side walls 106 and engages the corners 602 of the package substrate 122. The stiffener 810 generally may have any of the profiles described above for the stiffeners 154, 254, 354, 454, 500, or other suitable profile. Additionally, although the stiffener 810 is shown engaging the top surface 102 and side walls 106 of the package substrate 122, the stiffener 810 may alternatively be engage the bottom surface 104 and side walls 106 of the package substrate 122 as shown in FIG. 3, or engage the package substrate with a receiving pocket 518 as shown in FIG. 5.

In the implementation depicted in FIG. 8, the stiffener 810 includes at least one portion, for example a surface mounting pad 850, that overlays the top surface 102 at least one of the corners 602 of the package substrate 122. Other portions 852 of the stiffener 810 between the surface mounting pad 850 do overlays the top surface 102. In the illustrated example, the stiffener 810 includes four mounting pads 850 that overlay the top surface 102 at each of the corners 602 of the package substrate 122. The surface mounting pads 850 do not overlay the entire region (i.e., the portion 852) of the side wall 106 between adjacent corners 602.

Figure 9:
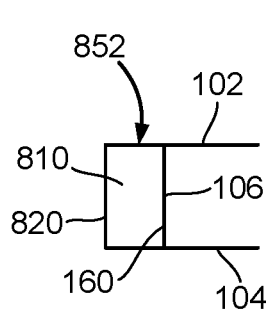
FIGS. 9-10 are sectional views of the stiffener of FIG. 8 taken respectively along section lines 9-9 and 10-10.
Figure 10:
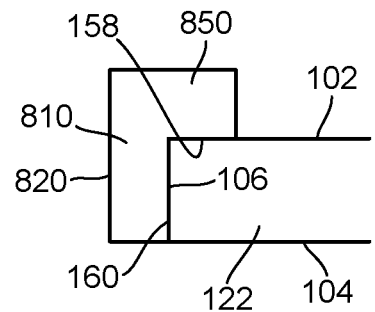

As better illustrated in the sectional view of FIG. 9 taken along section lines 9-9 of FIG. 8, the stiffener 810 includes a side mounting surface 160 and an outer wall 820. The side mounting surface 160 is bonded to the side wall 106 of the package substrate 122 as described above. As additionally illustrated in the sectional view of FIG. 10 taken along section lines 10-10 of FIG. 8, the stiffener 810 includes a bottom mounting surface 158 that is bonded to the top surface 102 of the package substrate 122 as described above.

Alternatively, the mounting pads 850 may overlay the bottom surface 104 of the package substrate 122. In such an implementation, the stiffener 810 is configured to include a top mounting surface 358 that is bonded to the bottom surface 104 of the package substrate 122, as described above with reference to FIG. 3.

Figure 11:
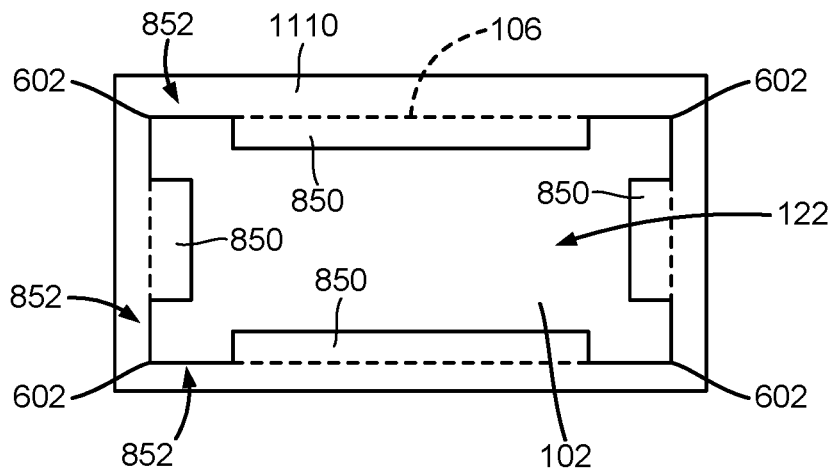

FIG. 11 is a top view of a stiffener 1110 that may be utilized in an integrated chip package assembly, such as the integrated chip package assemblies 100, 200, 300, 400 of FIGS. 1-4, among others. The stiffener 1110 is similar to the stiffener 810 describe above, except that stiffener 1110 includes at least one surface mounting pad 850 that overlays the top surface 102 between the corners 602 of the package substrate 122. The corners 602 of the package substrate 122 are generally exposed by the stiffener 1110.

In the illustrated example, the stiffener 1110 includes four mounting pads 850 that overlay the top surface 102 between each of the corners 602 of the package substrate 122. The surface mounting pads 850 of the stiffener 1110 do not overlay the corners 602 of the package substrate 122. The portion of the stiffener 1110 not overlaying the top surface 102 is configured as shown in the sectional view of the stiffener 810 illustrated in FIG. 9. The portion of the stiffener 1110 overlaying the top surface 102 (i.e., the surface mounting pad 850) is configured as shown in the sectional view of the stiffener 810 illustrated in FIG. 10.

The stiffener 1110 may be secured to the package substrate 122 of the chip package assembly 100 in any manner as described above, or other suitable manner. Although only a single ring-shaped stiffener 1110 is shown circumscribing the perimeter of the side walls 106 of the package substrate 122 in FIG. 11, multiple stiffener 1110 may be utilized.

The stiffener 1110 is disposed along edges of the side walls 106 and engages the corners 602 of the package substrate 122. The stiffener 810 generally may have any of the profiles described above for the stiffeners 154, 254, 354, 454, 500, or other suitable profile. Additionally, although the stiffener 1110 is shown engaging the top surface 102 and side walls 106 of the package substrate 122, the stiffener 1110 may alternatively be engage the bottom surface 104 and side walls 106 of the package substrate 122 as shown in FIG. 3, or engage the package substrate with a receiving pocket 518 as shown in FIG. 5.

In the implementation depicted in FIG. 11, the stiffener 1110 includes at least one surface mounting pad 850 that overlays the top surface 102 between at least two of the corners 602 of the package substrate 122. In the illustrated example, the stiffener 1110 includes four mounting pads 850 that overlay the top surface 102 between each of the corners 602 of the package substrate 122. The surface mounting pads 850 do not overlay the corners 602 of the package substrate 122.

Alternatively, the mounting pads 850 may overlay the bottom surface 104 of the package substrate 122. In such an implementation, the stiffener 810 is configured to include a top mounting surface 358 that is bonded to the bottom surface 104 of the package substrate 122, as described above with reference to FIG. 3.

Figure 12:
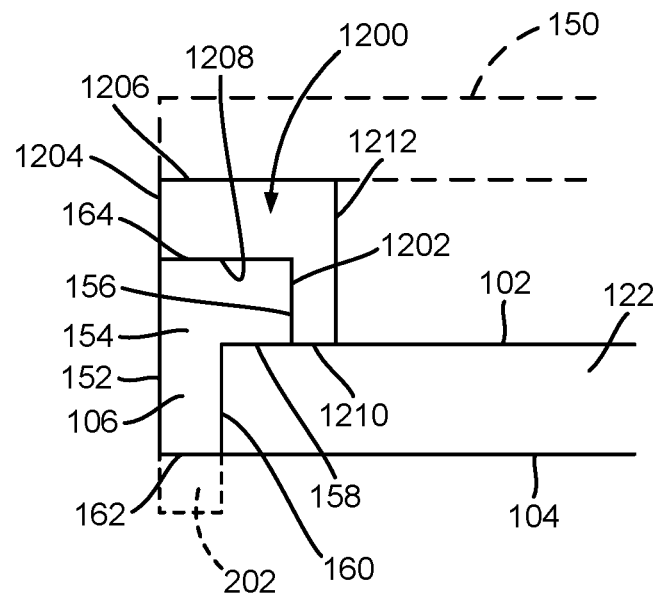
FIGS. 12-13 are partial sectional views of a stiffener with adapter that may be utilized in an integrated chip package assembly, such as the integrated chip package assemblies of FIGS. 1-4.
Figure 13:
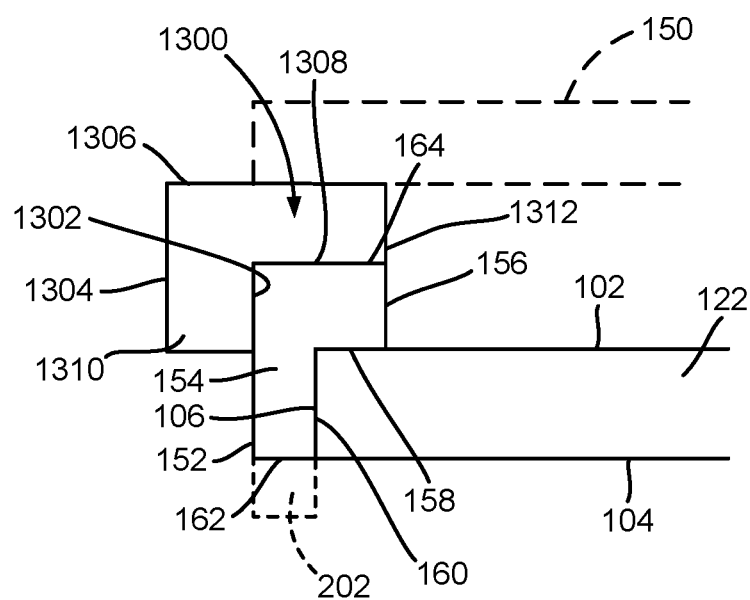

FIGS. 12-13 are partial sectional views of a stiffener 154 interfaced with an adapter 1200 or an adapter 1300 that may be utilized in an integrated chip package assembly, such as the integrated chip package assemblies 100, 200, 300, 400 of FIGS. 1-4, among others. Although the adapters 1200, 1300 are illustrated in FIGS. 12-13 as interfacing with the stiffener 154, the adapters 1200, 1300 may be utilized with the other stiffeners described herein. For example, the stiffener 154 may include a standoff portion 202 as shown in FIG. 4.

The adapter 1200 may be fabricated from the same materials as the stiffener 154. The adapter 1200 is bonded to the stiffener 154 to increase the rigidity of the package substrate 122. The adapter 1200 may be bonded to the stiffener 154 utilizing any suitable adhesives, such as the adhesives utilized to bonded the stiffener 154 to the package substrate 122. Alternatively, the adapter 1200 may be mechanically coupled to the stiffener 154. If an optional lid 150 is incorporated into the chip package assembly, the lid 150 may be bonded to the adapter 1200.

Referring first to the implementation depicted in FIG. 12, the adapter 1200 includes a top wall 1206, a bottom wall 1210, an inner wall 1212 and an outer wall 1204. The adapter 1200 also includes an outer mounting surface 1202 and a bottom mounting surface 1208. At least one or both of the mounting surfaces 1202, 1208 are bonded to the adjacent surface of the stiffener 154, thereby increasing the overall stiffness of the stiffener/adaptor assembly, and consequently, the increasing the stiffness of the package substrate 122 mounted thereto. The interface between the outer mounting surface 1202 and the inner wall 156 of the stiffener 154 precisely locates the adapter 1200 on the stiffener 154.

Referring now to the implementation depicted in FIG. 13, the adapter 1300 includes a top wall 1306, a bottom wall 1310, an inner wall 1312 and an outer wall 1304. The adapter 1300 also includes an inner mounting surface 1302 and a bottom mounting surface 1308. At least one or both of the mounting surfaces 1302, 1308 are bonded to the adjacent surface of the stiffener 154, thereby increasing the overall stiffness of the stiffener/adaptor assembly, and consequently, the increasing the stiffness of the package substrate 132 mounted thereto. The interface between the inner mounting surface 1302 and the outer wall 152 of the stiffener 154 precisely locates the adapter 1300 on the stiffener 154.

The adapters 1200, 1300 allow a standardized stiffener to be utilized with a predefined package substrate in a large variety of IC package assembly configurations, with only the simple and inexpensive adapter needing to be customized for a specific design. For example, the adapters 1200, 1300 may be utilized with any of the stiffeners 154, 254, 454, 500, 710, 810, 1110 described above, with or without lids 150. Use of a standardized stiffener and package substrate size allows different chip package assemblies to be fabricated more rapidly with less expense.

Figure 14:
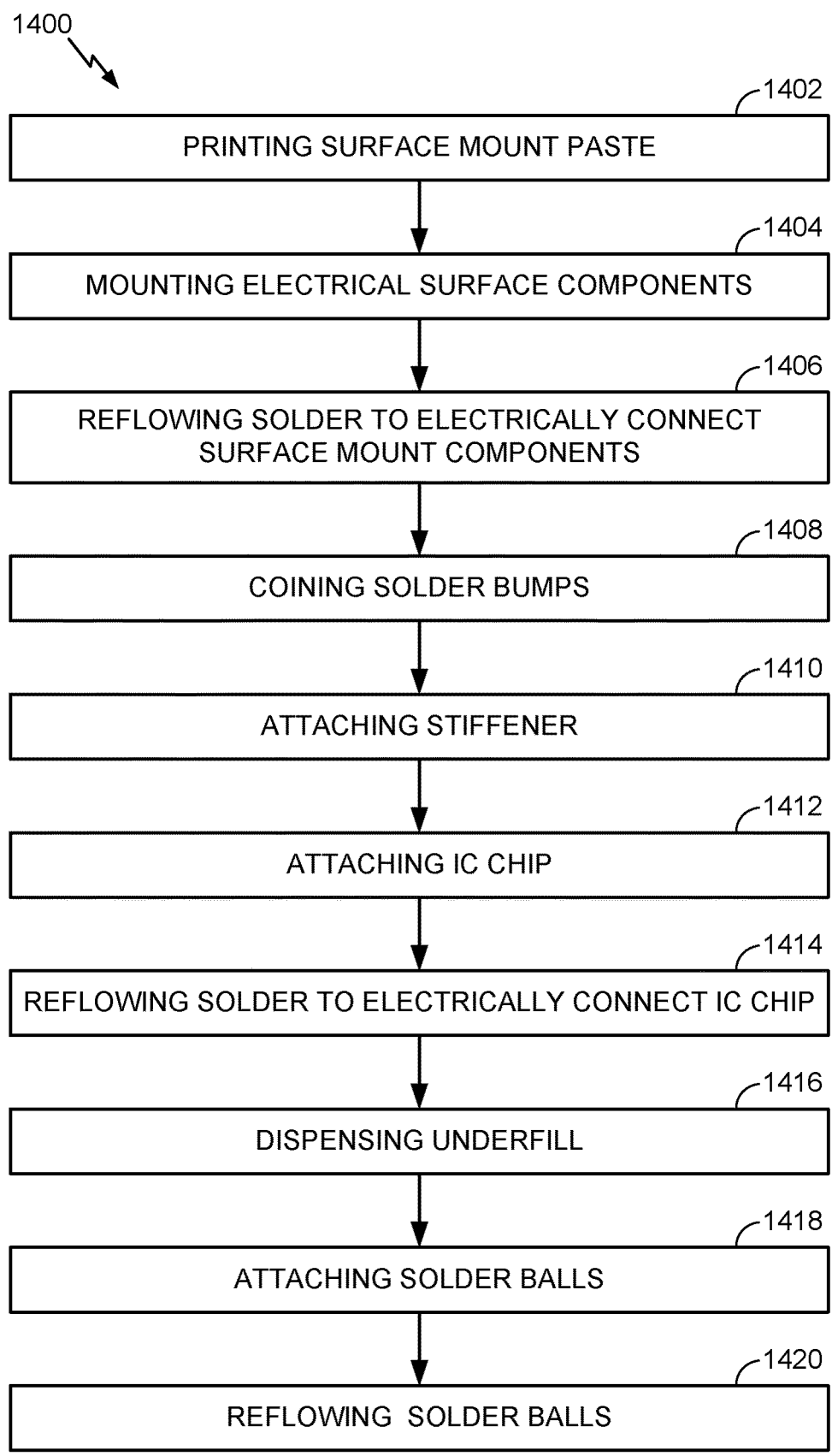
FIG. 14 is a block diagram of one example of a method for forming a chip package assembly having improved stiffener.

FIG. 14 is a block diagram of one example of a method 1400 for forming a chip package assembly 100 having improved stiffener. The stiffener may be any of the stiffeners described above, or other suitable stiffener. The method 1400 begins at block 1402 by printing surface mounting paste on a substrate, such as the package substrate 122, at pad locations where surface components are to be placed. The surface mounting paste may be printed using screen printing, ink jet printing or other suitable process.

At block 1404, surface components, such as diodes, capacitors, resistors and the like, are mounted to the surface mounting paste. At block 1406, a first reflow process is performed to reflow solder to electrically connect the component leads of the surface components to the pads on the package substrate 122. The first reflow process may be performed in a conveyor oven or using other suitable technique. At block 1408, solder bumps formed on the package substrate 122 are coined. Package bumps 120 are then formed on the coined surface.

At block 1410, the stiffener is attached to the package substrate 122. As discussed above, the stiffener may be attached to the side wall 106 and at least one of the top and bottom surfaces 102, 104 of the package substrate 122 using an epoxy or other suitable adhesive. At block 1412, IC chips, such as the IC dice 114, are attached to the package substrate 122. The IC dice 114 may be directly attached to the package substrate 122, or an interposer 112 already having the IC dice 114 mounted thereon may be attached to the package substrate 122. As the stiffener is already attached to the package substrate 122, the package substrate 122 is less susceptible to warpage and/or bowing during the chip attach process at block 1412.

At block 1414, a second reflow process is performed to reflow solder in the package bumps 120 to electrically connect the IC dice 114 to the package substrate 122. The second reflow process may be performed in a conveyor oven or using other suitable technique. As the stiffener is already attached to the package substrate 122, the package substrate 122 is less susceptible to warpage and/or bowing due to thermal expansion during the second reflow process performed at block 1414.

At block 1416, underfill, such as the undermolding 144, is dispensed between the package substrate 122 and interposer 112. If the IC dice 114 are directly mounted to the package substrate 122, the underfill may be directly disposed between the IC dice 114 and the package substrate 122. Optionally, if a lid 150 is utilized, the lid 150 may be disposed over the IC dice 114 and coupled to the stiffener after the underfill process is complete at block 1416.

At block 1418, solder balls 134 are attached to a side of the package substrate 122 opposite the IC dice 114. As the stiffener is already attached to the package substrate 122, the package substrate 122 is less susceptible to warpage and/or bowing during the solder ball attach process performed at block 1418.

At block 1420, a third reflow process is performed to reflow solder in the solder balls 134 to electrically connect the package substrate 122 to the PCB 136. The third reflow process may be performed in a conveyor oven or using other suitable technique. As the stiffener is already attached to the package substrate 122, the package substrate 122 is less susceptible to warpage and/or bowing due to thermal expansion during the third reflow process performed at block 1420.

Figure 15:
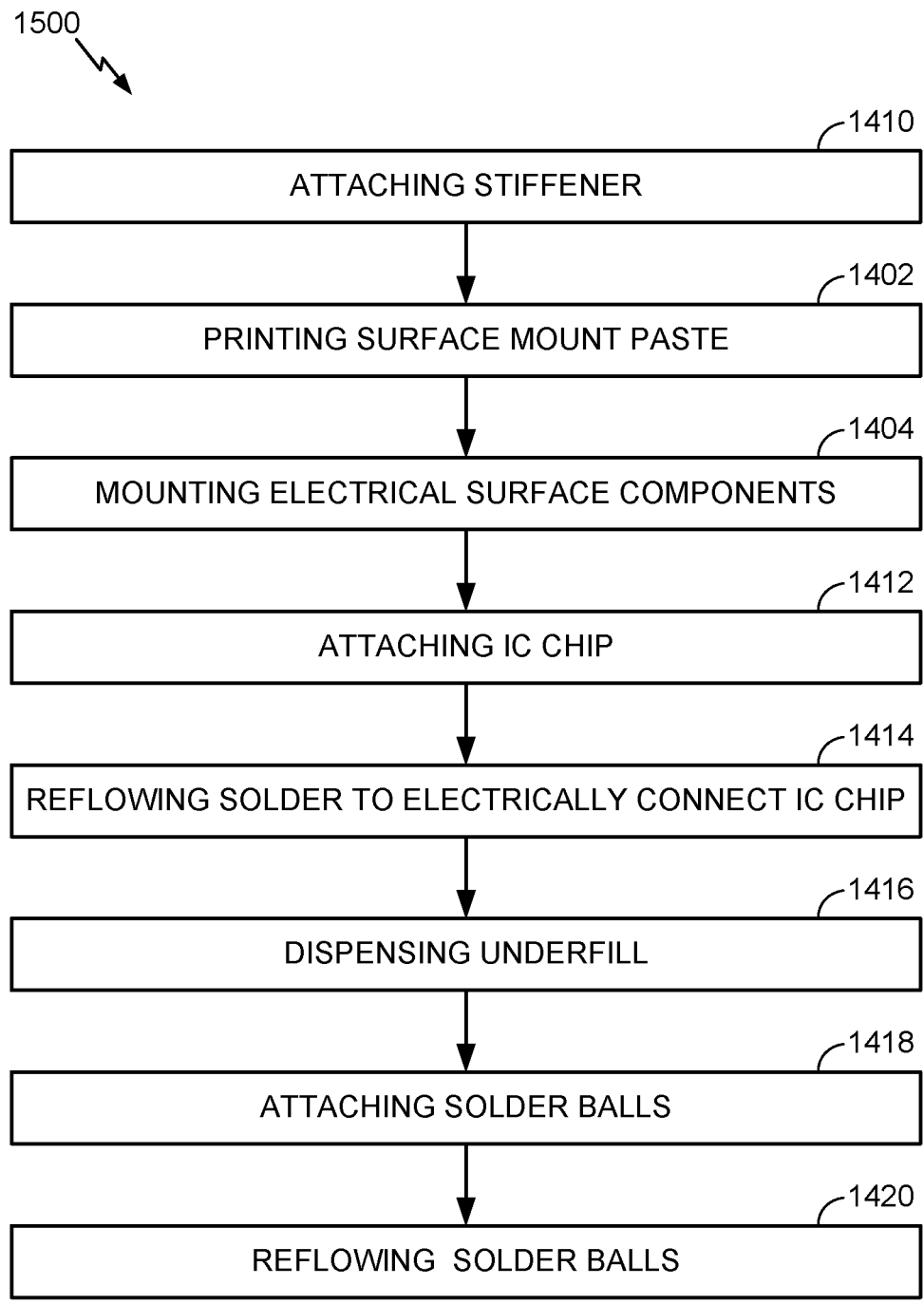
FIG. 15 is a block diagram of another example of a method for forming a chip package assembly having improved stiffener.

FIG. 15 is a block diagram of another example of a method 1500 for forming a chip package assembly 100 having improved stiffener. The stiffener may be any of the stiffeners described above, or other suitable stiffener. The method 1500 begins at block 1410 wherein a stiffener is attached to a package substrate 122. As discussed above, the stiffener may be attached to the side wall 106 and at least one of the top and bottom surfaces 102, 104 of the package substrate 122 using an epoxy or other suitable adhesive.

At block 1402 by printing surface mounting paste on a substrate, such as the package substrate 122, at pad locations where surface components are to be placed. The surface mounting paste may be printed using screen printing, ink jet printing or other suitable process. At block 1404, surface components, such as diodes, capacitors, resistors and the like, are mounted to the surface mounting paste.

At block 1412, IC chips, such as the IC dice 114, are attached to the package substrate 122. The IC dice 114 may be directly attached to the package substrate 122, or an interposer 112 already having the IC dice 114 mounted thereon may be attached to the package substrate 122. As the stiffener is already attached to the package substrate 122, the package substrate 122 is less susceptible to warpage and/or bowing during the chip attach process at block 1412.

At block 1414, a reflow process is performed to reflow solder in the package bumps 120 to electrically connect the IC dice 114 to the package substrate 122. The reflow process may be performed in a conveyor oven or using other suitable technique. As the stiffener is already attached to the package substrate 122, the package substrate 122 is less susceptible to warpage and/or bowing due to thermal expansion during the reflow process performed at block 1414.

At block 1416, underfill, such as the undermolding 144, is dispensed between the package substrate 122 and interposer 112. If the IC dice 114 are directly mounted to the package substrate 122, the underfill may be directly disposed between the IC dice 114 and the package substrate 122. Optionally, if a lid 150 is utilized, the lid 150 may be disposed over the IC dice 114 and coupled to the stiffener after the underfill process is complete at block 1416.

At block 1418, solder balls 134 are attached to a side of the package substrate 122 opposite the IC dice 114. As the stiffener is already attached to the package substrate 122, the package substrate 122 is less susceptible to warpage and/or bowing during the solder ball attach process performed at block 1418.

At block 1420, another reflow process is performed to reflow solder in the solder balls 134 to electrically connect the package substrate 122 to the PCB 136. The reflow process performed at block 1420 may be performed in a conveyor oven or using other suitable technique. As the stiffener is already attached to the package substrate 122, the package substrate 122 is less susceptible to warpage and/or bowing due to thermal expansion during the reflow process performed at block 1420.

One advantage of the methods 1400, 1500 is that the stiffener attach at block 1410 occurs prior to the chip attach at block 1412, which happens in reverse order when practicing a conventional fabrication process. Attaching the stiffener prior to the chip reduces warpage that may be induced during the subsequent solder reflows. Thus, the methods 1400, 1500 keeps the substrate flat during chip-attach reflow, ensuring proper C4 joint formation. Additionally, the flatter chip package assembly 100, imparts less stress on the C4 solder joints, as compared to conventionally fabricated chip packages, and thus, helps prevent post-reflow solder joint defects from occurring.

Thus, a chip package assembly and method for fabricating the same have been provided which utilize a stiffener to improve the resistance of a package substrate to out of plane deformation. The implementations described above advantageously provide one or more of the following benefits: enhanced warpage control while maintaining lower package profile; BGA solder ball height collapse control; stiffener standardization through use of customizable adaptors; pre-attached stiffeners for enhanced warpage control at chip-attach reflow; larger stiffeners that provide greater surface area for clamping during package fabrication; edge protection for the package substrate during handling and processing; and mechanical damage protection for BGA solder balls, among other benefits.

While the foregoing is directed to embodiments of the present invention, other and further embodiments of the invention may be devised without departing from the basic scope thereof, and the scope thereof is determined by the claims that follow.

What is claimed is:

1. A chip package assembly, comprising:
    a package substrate having a first surface and a second surface coupled by a side wall;
    at least one integrated circuit (IC) die disposed on the first surface of the package substrate;
    a stiffener having a first surface disposed outward of and bonded to the side wall of the package substrate, the stiffener having a second surface bonded to at least one of the first and second surfaces of the package substrate, the stiffener circumscribing the IC die, the stiffener including a third surface disposed opposite the first surface of the stiffener and parallel thereto;
    an adapter, not integral with the package substrate and the stiffener, coupled to the stiffener, the adapter including an outer wall substantially aligned with the third surface of the stiffener; and
    a plurality of solder balls disposed on the second surface of the package substrate.

2. The chip package assembly of claim 1, wherein the stiffener is bonded to the adapter and the first surface of the package substrate.

3. The chip package assembly of claim 1, wherein the stiffener is bonded to the adapter and the second surface of the package substrate.

4. The chip package assembly of claim 1, wherein the stiffener further comprises:
    a standoff portion projecting below the second surface of the package substrate.

5. The chip package assembly of claim 4, wherein the solder balls extend a distance from the second surface of the package substrate beyond the standoff portion.

6. The chip package assembly of claim 1, further comprising:
    a lid coupled to the stiffener and extending across the IC die.

7. The chip package assembly of claim 6, wherein the stiffener is bonded to the first surface of the package substrate and to the lid.

8. The chip package assembly of claim 6, wherein the stiffener is bonded to the second surface of the package substrate and to the lid.

9. The chip package assembly of claim 6, wherein the stiffener further comprises:

a standoff portion projecting below the second surface of the package substrate.

10. The chip package assembly of claim 9, wherein the solder balls extend a distance from the second surface of the package substrate beyond the standoff portion.

11. The chip package assembly of claim 1, wherein the stiffener is bonded to the side wall and the second surface of the package substrate.

12. A chip package assembly comprising:
a package substrate having a first surface and a second surface coupled by a side wall;
at least one integrated circuit (IC) die disposed on the first surface of the package substrate;
a stiffener circumscribing the IC die and having:
a first surface disposed outward of and bonded to the side wall of the package substrate;
a second surface bonded to at least one of the first and second surfaces of the package substrate and including:
a first portion covering a first corner of the package substrate; and
a second portion covering a second corner of the package substrate, wherein the second surface of the stiffener is discontinuous between the first and second portions; and
a third surface disposed opposite the first surface of the stiffener and parallel thereto; and
an adapter, not integral with the package substrate and the stiffener, coupled to the stiffener, the adapter including an outer wall substantially aligned with the third surface of the stiffener.

13. The chip package assembly of claim 1, wherein the second surface of the stiffener covers only a portion of the first surface or the second surface of the package substrate.

14. The chip package assembly of claim 1, wherein the stiffener comprises:
a plurality of stiffener segments, each segment bonded to a different portion of the package substrate.

15. The chip package assembly of claim 1, wherein a material of the adapter and a material of the stiffener are the same.

16. The chip package assembly of claim 1, wherein the adapter is bonded to the stiffener.

17. The chip package assembly of claim 1, wherein the adapter is mechanically coupled to the stiffener.

18. The chip package assembly of claim 1, wherein the adapter includes a top wall, a bottom wall parallel to the top wall, an inner wall perpendicular to the top wall, the outer wall parallel to the inner wall, an outer mounting surface parallel to the inner wall, and a bottom mounting surface parallel to the top wall, and wherein at least one of the outer mounting surface and the bottom mounting surface is bonded to the stiffener.

19. The chip package assembly of claim 1, wherein the adapter includes a top wall, a bottom wall parallel to the top wall, an inner wall perpendicular to the top wall, an outer wall parallel to the inner wall, an inner mounting surface parallel to the outer wall, and a bottom mounting surface parallel to the top wall, and wherein at least one of the inner mounting surface and the bottom mounting surface is bonded to the stiffener.

20. The chip package assembly of claim 19, wherein the outer wall of the adapter is spaced apart from the stiffener by a length of the bottom wall.

21. A chip package assembly, comprising:
a package substrate having a first surface and a second surface coupled by a side wall;
at least one integrated circuit (IC) die disposed on the first surface of the package substrate;
a stiffener circumscribing the IC die and having:
a first surface disposed outward of and bonded to the side wall of the package substrate;
a second surface bonded to at least one of the first and second surfaces of the package substrate;
a third surface disposed opposite the first surface of the stiffener and parallel thereto; and
a standoff portion projecting below the second surface of the package substrate; and
an adapter, not integral with the package substrate and the stiffener, coupled to the stiffener, the adapter including an outer wall substantially aligned with the third surface of the stiffener.

* * * * *